United States Patent
Viebach

[11] Patent Number: 5,915,030
[45] Date of Patent: *Jun. 22, 1999

[54] ELECTRIC MUTING CIRCUIT

[75] Inventor: Michael Viebach, Kolbermoor, Germany

[73] Assignee: STMicroelectronics, GmbH, Grasbrunn, Germany

[*] Notice: This patent is subject to a terminal disclaimer.

[21] Appl. No.: 08/900,324

[22] Filed: Jul. 25, 1997

[30] Foreign Application Priority Data

Jul. 26, 1996 [DE] Germany .................. 196 30 395

[51] Int. Cl.$^6$ .................................. H04B 15/00
[52] U.S. Cl. .................. 381/94.5; 330/284; 381/104
[58] Field of Search ................. 381/94.5, 94.1, 381/104, 109, 106; 330/284

[56] References Cited

U.S. PATENT DOCUMENTS

| | | | |
|---|---|---|---|
| 4,731,851 | 3/1988 | Christopher | 381/104 |
| 5,584,060 | 12/1996 | Herrmann et al. | |
| 5,592,557 | 1/1997 | Chahabadi et al. | |
| 5,596,651 | 1/1997 | Yamaguchi | 381/104 |
| 5,606,619 | 2/1997 | Chahabadi et al. | |
| 5,661,809 | 8/1997 | Chahabadi et al. | |
| 5,661,810 | 8/1997 | Chahabadi et al. | |
| 5,673,324 | 9/1997 | Kässer et al. | |
| 5,696,830 | 12/1997 | Chahabadi et al. | |
| 5,717,726 | 2/1998 | Herrmann et al. | |

FOREIGN PATENT DOCUMENTS

| | | |
|---|---|---|
| 4318867 A1 | 12/1993 | Germany . |
| 4227680 A1 | 2/1994 | Germany . |
| 4309518 A1 | 10/1994 | Germany . |

*Primary Examiner*—Ping Lee
*Attorney, Agent, or Firm*—David V. Carlson; Brian L. Johnson; Seed and Berry

[57] ABSTRACT

An electric muting circuit for soft muting of an audio signal is shown. It comprises a digitally controllable attenuation circuit having an audio signal input, an audio signal output and a control signal input and also comprises an up/down counter having a clock pulse input fed with clock pulses to be counted, a counting control input fed with a counting control signal controlling counting start and counting stop, and a count signal output from which a digital count signal is available and which a digital count signal input of the attenuation circuit.

19 Claims, 4 Drawing Sheets

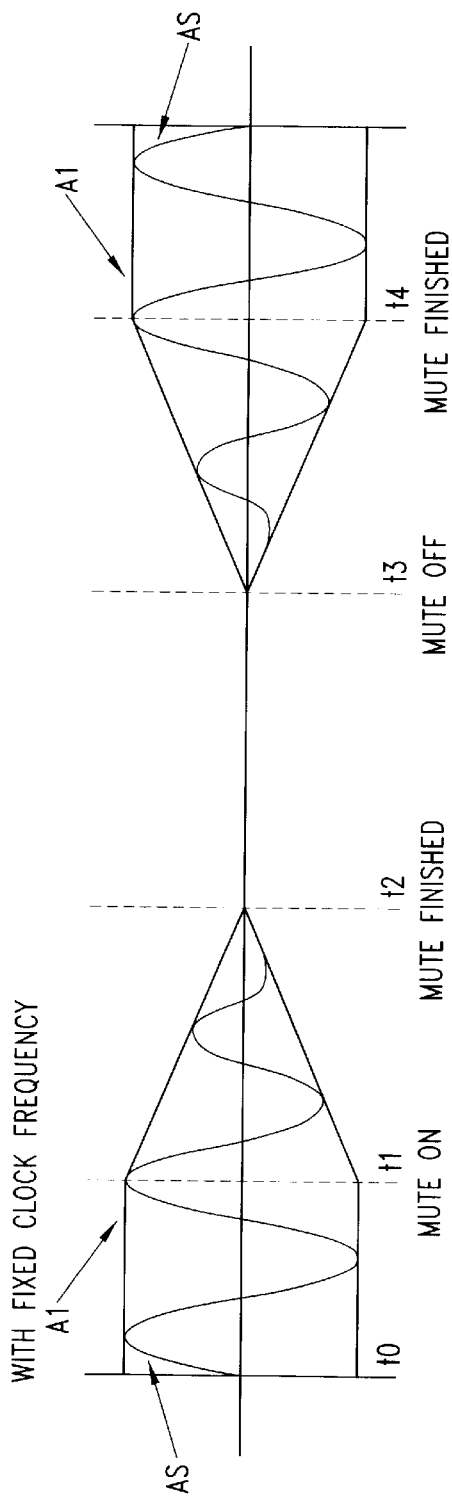
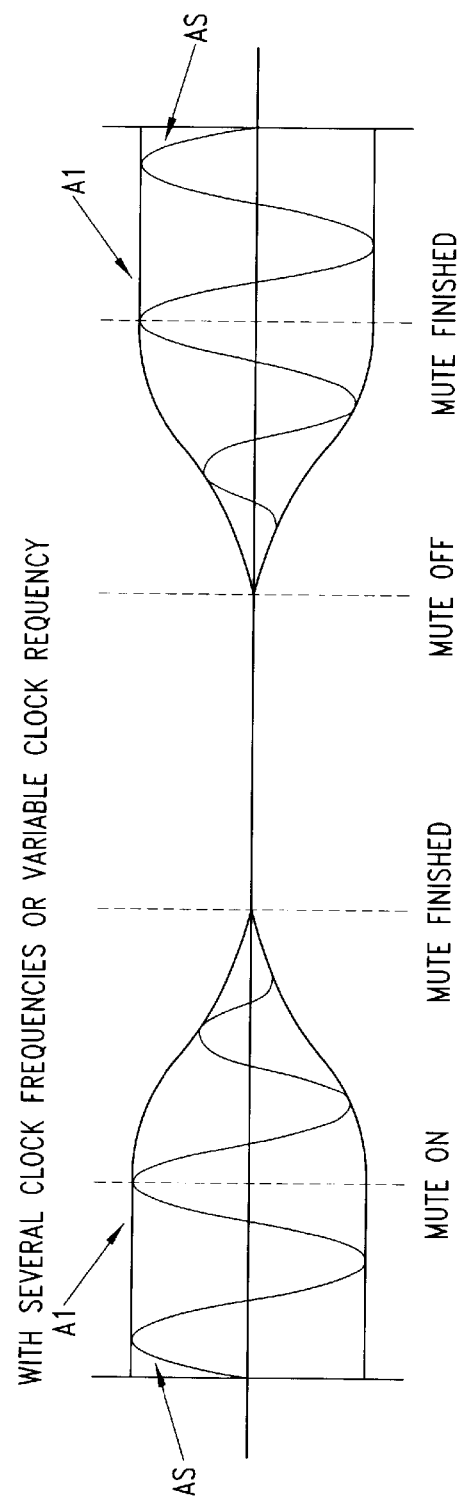

ELECTRIC MUTING CIRCUIT

TECHNICAL FIELD

The invention relates to an electric muting circuit for soft muting of an audio signal.

BACKGROUND OF THE INVENTION

With present-day audio apparatus, there is the possibility of switching the same to a mute condition (muting) during specific switching operations to avoid the switching noise becoming audible in the loudspeakers.

An example in this respect are RDS radio apparatus capable of processing RDS signals. RDS stands for Radio Data System and means that the broadcasting station broadcasts signals in addition to the regular audio signals. These inaudible signals serve, for example, to display the name or an abbreviation of the radio station received at the particular time and contain information on additional transmitter frequencies of the received radio program other than the frequency received at a particular time.

There are various suggestions to protect the listener of an RDS receiver from noise due to a too poor receiving quality or from other disturbing noise.

The document DE 42 27 680 A1 discloses an FM receiver with RDS evaluation which, during receipt of an RDS program on a first frequency, switches temporarily to at least one second alternative frequency of the received program in order to examine the receiving quality thereof, with the receiver being muted on the reproduction side during the examination.

The document DE 43 18 667 A1 reveals an audio apparatus having an RDS receiver, a CD player and a tape player, wherein, when the receiving quality threatens to become too poor, for example in case of an RDS car radio upon entering a tunnel, unpleasant noise caused thereby is avoided in that the apparatus. During the time in which the receiving quality drops below a specific threshold value, the apparatus automatically switches over to reproduction of the audio signal from the CD player or the tape player, respectively.

The document DE 43 09 518 A1 discloses an RDS receiver in which the LF signal is attenuated temporarily in case of too poor receiving quality. To this end, an auxiliary signal dependent on the field strength and an additional auxiliary signal are continuously derived from the demodulated signal, and these two auxiliary signals are combined to form the quality signal. The one auxiliary signal is used to determine whether there are amplitudes of signal portions above 60 kHz which are above a threshold value. The second auxiliary signal is used for assessing whether or not the two sidebands of the two-sideband amplitude modulation are arranged symmetrically with respect to the carrier. An asymmetry in this respect indicates that an audible disturbance is present in the LF signal.

A feature of RDS radio apparatus consists in that, when the receiving quality of the radio program received at the particular moment drops below a predetermined quality value, automatic switching over to another one of the receiving frequencies of the same program, which are communicated in the RDS signal, takes place.

Solutions have been found permitting the switching operation to be performed so rapidly that the listener does not at all notice switching to another receiving frequency. During such a frequency switching jump, the audio apparatus is briefly switched to a mute condition. Abrupt switching over to the mute condition causes cracking noise at the loudspeaker output. This can be avoided by a soft muting transition or soft muting, and the switching operation thus can be rendered even more inconspicuous for the listener.

With a conventional muting circuit for soft muting of an audio signal, a capacitor is used that is charged or discharged at a predetermined time constant, depending on whether a soft transition into the mute state (muting) or a soft transition from the mute state (demuting) takes place. The increasing charging voltage or the decreasing discharging voltage of the capacitor is utilized as an attenuation ramp by means of which the amplitude of the signal to be attenuated is increasingly reduced down to zero during muting and, upon leaving the mute condition, the amplitude of the signal is increasingly raised starting from zero. However, in reasonably priced circuits this is achieved only incompletely. Almost only the envelope curve of the signal to be muted is increasingly decreased or raised in accordance with the attenuation ramp, since in case of simple circuits only, a clamping or limiting operation takes place in which the signal to be muted is limited in increasingly stronger or lesser manner in accordance with the attenuation ramp.

What is problematic with such soft muting of conventional nature is that the limitation, resulting in trimming of the amplitude, causes a harmonic distortion of the limited audiG signal and necessitates a capacitor for such soft muting. Audio signal processors performing such signal processing operations nowadays are designed as monolithic high-integrated circuits. Capacitors, as required for soft muting, cannot be accommodated with reasonable expenditure on such integrated circuits due to the long time constants required, and thus must be designed as external capacitors. By determining the capacitor size, the user can determine only a time constant for the muting operation. Such an external capacitor does not only result in an increase of the overall costs, but also necessitates an additional terminal pin of the integrated circuit. Integrated circuits having a large number of terminal pins necessitate complicated chip housings, entailing corresponding costs.

SUMMARY OF THE INVENTION

The applicant has developed a monolithic integrated audio signal processor performing audio signal processing of a stereo radio apparatus in a very large scope. This integrated circuit in operation takes recourse to a number of external circuit components, which are mainly capacitors. By way of a multiplicity of measures, the applicant has successfully provided a monolithic integrated circuit for audio signal processing that can make do with a considerably lesser number of external circuit components, with a corresponding reduction of terminal pins as compared to the conventional integrated circuit. This results in considerable cost savings, on the one hand in that a simpler housing can be used for the integrated circuit and on the other hand in that a considerable number of external circuit components can be saved.

In the scope of creating this improved integrated circuit, the invention avoids an external capacitor and the related terminal pin which have been necessary for conventional soft muting.

This object is met by an electric muting circuit for soft muting of an audio signal. According to the invention, the muting circuit comprises a digitally controllable attenuation circuit having an audio signal input, an audio signal output and a control signal input, and also contains an up/down counter having a clock pulse input for being fed with clock pulses to be counted, a counting control input for being fed with a counting control signal controlling counting start and counting stop, and a count signal output from which a digital count signal is available and which is connected to the control signal input of the attenuation circuit.

This muting circuit, performing soft control into the mute condition and from the mute condition, respectively, can be realized completely with circuit components that can be monolithically integrated without any problem, and thus no longer requires external circuit components and terminal pins provided for the same.

Due to the fact that with the muting circuit according to the invention, a genuine attenuation of the audio signal to be muted takes place instead of an amplitude trimming, the harmonic distortion caused in the conventional circuit is avoided in the muting circuit according to the invention.

When the counter counts clock pulses of a clock signal with a constant clock frequency, muting or demuting with a linearly changing signal amplitude occurs. However, it is also possible to employ a clock pulse signal whose clock frequency is variable in a predetermined manner. The attenuation curve with which the intensity of the audio signal is changed during muting or demuting, respectively, may thus be designed differently than linear.

To this end, it is possible to utilize a clock pulse source with a variable clock frequency. Another possibility consists of using several clock pulse sources with different clock frequencies and connecting between these clock pulse sources and the clock pulse input of the counter a selection means, preferably in the form of an electronic selector switch, to select one of the clock pulse sources for each particular case. It is possible to make the selection means controllable in accordance with one or several selection programs, under the control of which the clock pulse input of the counter can be fed with a clock signal having a clock frequency varying in predetermined manner. In this way it is possible to control a specific attenuation curve during muting and demuting.

For the sake of simplicity, the term muting in the following comprises not only the operation of attenuating the audio signal into the mute condition, but also the bringing of the audio signal out of the mute condition (demuting) by making it grow starting from zero.

In a particularly preferred embodiment of the muting circuit, the count signal output of the counter and the control signal input of the attenuation circuit are connected to each other via a data connection for digitally transferring an f-position data word representing the particular count signal in the binary number system, wherein n is a predetermined integer. The attenuation circuit contains a parallel connection connected between the audio signal input and a signal ground terminal and having n attenuation members each comprising: a partial voltage tap connected to the audio signal output, a first series connection connected between audio signal input and partial voltage tap and including a first resistor and a first controllable switch and, a second series connection connected between partial voltage tap and signal ground terminal and including a second resistor and a second controlled switch and, a switch control means via which the two switches of each attenuation member are controllable in opposite manner, such that in each particular case one of the two switches is rendered conducting and the respective other switch is rendered non-conducting. Each of the switch control means of the attenuation members can be fed with a different one of the n positions of the data word as switching control signal, and the resistances of the resistors of the individual attenuation members are different, depending on the significance or values of the positions of the data word associated with the individual attenuation members.

A muting circuit composed with such attenuation members, among other things, has the advantage that in the quiescent state, i.e. outside of the muting operations, no cross currents flow through the attenuation circuit, since in the quiescent state all first or all second switches are always rendered non-conducting. With this attenuation circuit, there is thus no power loss arising outside of the muting and demuting operations.

Particularly preferred is an attenuation circuit in which the switches of the attenuation members are each composed with a MOS switch having the double function both of the switch and of the associated resistor, with the ON-resistor thereof constituting the respectively associated resistor of the attenuation member. Particularly preferred in case of this embodiment is that neither resistors nor capacitors are necessary and the entire muting circuit can be made completely in MOS process technology, i.e., with a relatively simple manufacturing technology.

Each of the MOS switches can be realized by one single MOS transistor. However, preferably each of the MOS switches is composed with a parallel connection comprising an NMOS transistor having an N-channel and a PMOS transistor having a P-channel, which can always be switched simultaneously into the conducting or the non-conducting state; in the activated state, the ON-resistors arranged in parallel to each other constitute the respectively associated resistor of the attenuation member. This embodiment is suited to achieve a farther-reaching linearity for the resulting ON-resistor than in case of use of only one MOS transistor per switch, and distortions of the audio signal thus can be reduced even more.

The data line connecting counter and attenuation circuit may be designed as a parallel data line having n bit lines, and the control signal input of the attenuation circuit may have n control signal inputs in a corresponding manner. In each attenuation member, the gate electrode of the MOS transistor belonging to the first resistor and the gate electrode of the PMOS transistor belonging to the second resistor may be connected directly to the associated control signal terminal, and the gate electrode of the PMOS transistor belonging to the first resistor and the gate electrode of the NMOS transistor belonging to the second resistor may be connected via an inverter to the associated control signal, or vice versa. The result hereof is that the digital control signal fed to the individual attenuation member effects opposite switching of the two switches of the respective attenuation member, which are constituted by a transistor pair each, such that the respective transistor pair belonging to the one switch is rendered conducting and the respective transistor pair belonging to the other switch is rendered non-conducting.

BRIEF DESCRIPTION OF THE DRAWINGS

The invention will be explained now in more detail by embodiments with reference to the drawings.

FIG. 2 shows audio signal patterns during muting by means of a constant clock frequency.

FIG. 3 shows audio signal patterns during muting by means of a variable clock frequency.

DETAILED DESCRIPTION OF THE INVENTION

Figure 1:
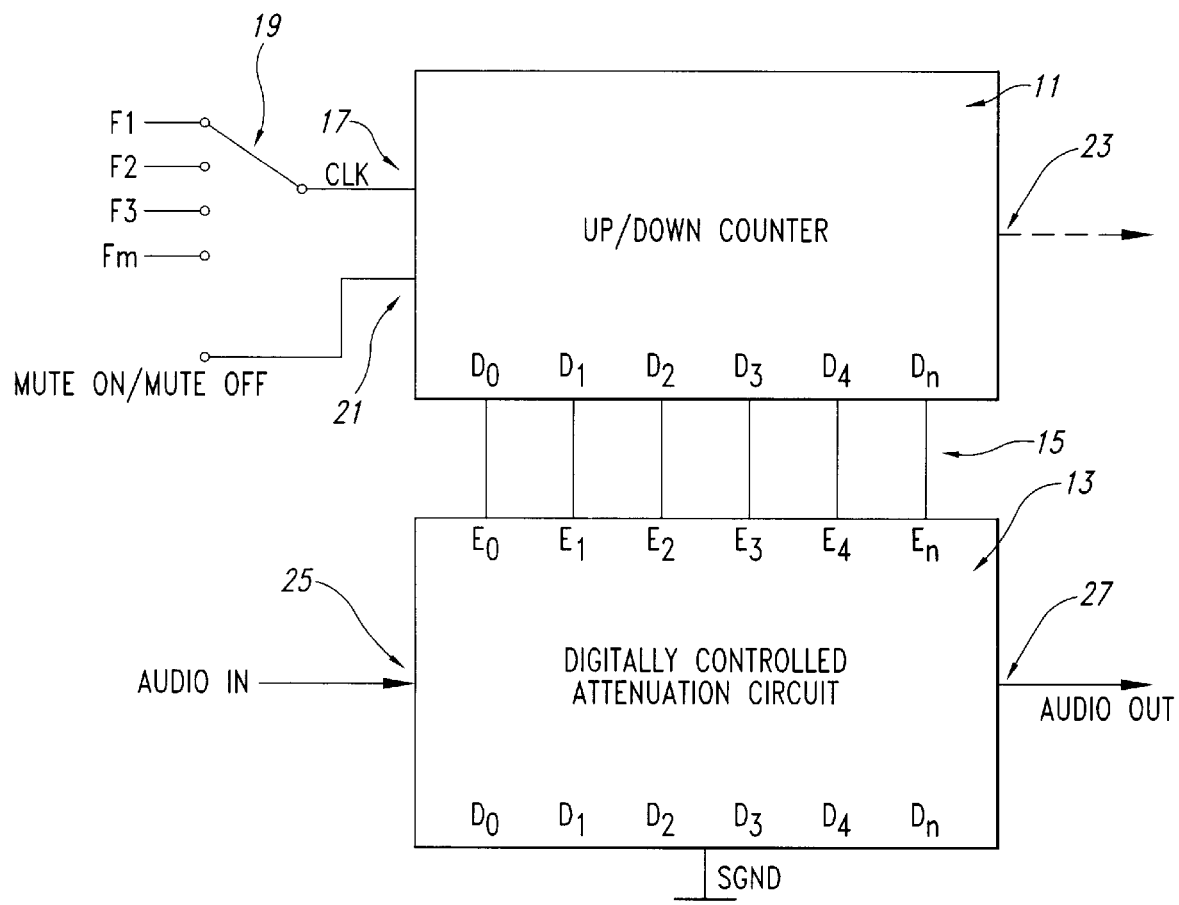
FIG. 1 shows a block diagram of an embodiment of a muting circuit according to the invention.

The muting circuit shown in FIG. 1 comprises up/down counter 11 and a digitally controlled attenuation circuit 13 which are connected to each other via a parallel data line 15 including six individual lines in the embodiment shown in FIG. 1.

Counter 11 comprises a clock pulse input 17 which can be fed with clock pulses CLK to be counted. Clock pulse input 17 is connectable, via a selector switch 19, to one of several clock pulse sources F1, F2, F3, . . . Fm, each having different clock frequencies. In addition thereto, the counter comprises a counting control input 21 for being fed with a counting control signal MUTE ON/MUTE OFF controlling counting start and counting stop. Counter 1 comprises furthermore a control signal output 23 at which counter 11, at the end of each muting operation, issues a signal MUTE FINISHED. Finally, counter 11 has a count signal output having n count signal output terminals D0, D1, D2, D3, D4 . . . . Dn, with the number n thereof corresponding to the number of the individual lines of data line 15.

Attenuation circuit 13 has an audio signal input 25, an audio signal output 27, a signal ground terminal SGND and a control signal input with n control signal input terminals E0, E1, E2, E3, E4, . . . . En, with n being again equal to the number of the individual lines of data line 15.

Via data line 15, the respective count reached by counter 11 is transferred via an n-position data word representing the respective count the binary number system, with n being an integer. In the embodiment shown in FIG. 1, n=6.

The mode of operation of the muting circuit shown in FIG. 1 will now be elucidated by way of FIGS. 2 and 3.

FIG. 2 shows an audio signal AS having a constant amplitude A1 at a moment of time to. It is assumed now that the clock pulse input 17 of counter 11 at that moment of time is connected to clock pulse source F1 via selector switch 19.

At a moment of time t1, counting control input 21 of counter 11 is fed with the signal MUTE ON, causing a counting start of counter 11, whereupon counter 11 begins to count the clock pulses CLK supplied thereto. With a gradual change of the count of counter 11, the overall attenuation factor of digitally controlled attenuation circuit 13 is changed gradually, and the amplitude of the audio signal sent through attenuation circuit 13 is thus changed gradually. At a specific first count of counter 11, the audio signal AS is subjected to minimum attenuation, whereas it is subjected to maximum attenuation at another predetermined count of the counter. Starting from the moment of time t1, the counter, starting from the count effecting minimum signal attenuation or substantially no signal attenuation, begins to count in the direction towards the count effecting maximum attenuation, which is reached at a moment of time t2. At this moment of time, audio signal AS is attenuated to zero or substantially zero, and the process of further muting is thus terminated. At this count, the counter issues via its control signal output 23 the signal MUTE FINISHED which is used for other control operations, for example for triggering a switching operation to be performed in the mute state, for example an RDS frequency jump.

If the process during which muting is desired is terminated at the moment of time t3 return of the audio signal AS to its unattenuated amplitude A1 is begun by means of the muting circuit shown in FIG. 1. To this end, the counter starts to count in reverse direction as compared to that direction between the moments of time t1 and t2, resulting in a gradually lower attenuation of the audio signal AS by the attenuation circuit 13 and thus in a gradual increase thereof. At the moment of time t4, counter 11 has reached again the count effecting minimum attenuation. At this moment of time, the signal MUTE FINISHED is issued again via control signal output 23 of counter 11.

Because the clock pulse input 17 of counter 11, in the muting operation shown in FIG. 2, is fed with a clock pulse signal of uniform clock frequency, the constant amplitude change shown in FIG. 2 results.

FIG. 3 shows muting operations in which the amplitude attenuation during muting and demuting, respectively, does not take place with a constant amplitude change, but according to a predetermined non-linear characteristic. This is achieved by switching the selector switch 19, at predetermined moments of time between t1 and t2, successively to different clock pulse sources F1 to Fm, so that the counting speed of counter 11 is changed in corresponding manner. This results in a correspondingly differently rapid attenuation change of attenuation circuit 13 and thus in the non-linear attenuation pattern according to FIG. 3.

It is possible to control selector switch 19, which preferably is in the form of an electronic switch means, by means of a selection program which, upon triggering of a muting operation, automatically performs switching of selector switch 19 according to the program. This selection program can be designed in accordance with the individual applications.

The signal MUTE FINISHED may also be used for preparing counter 11 for the respective other counting direction upon termination of a muting operation at the moment of time t2 or upon termination of an demuting operation at the moment of time t4, respectively. Another possibility is to generate an overflow bit when the maximum counting value of counter 11 is reached, which indicates the reversal of the counting direction of counter 11 should occur.

Figure 4:
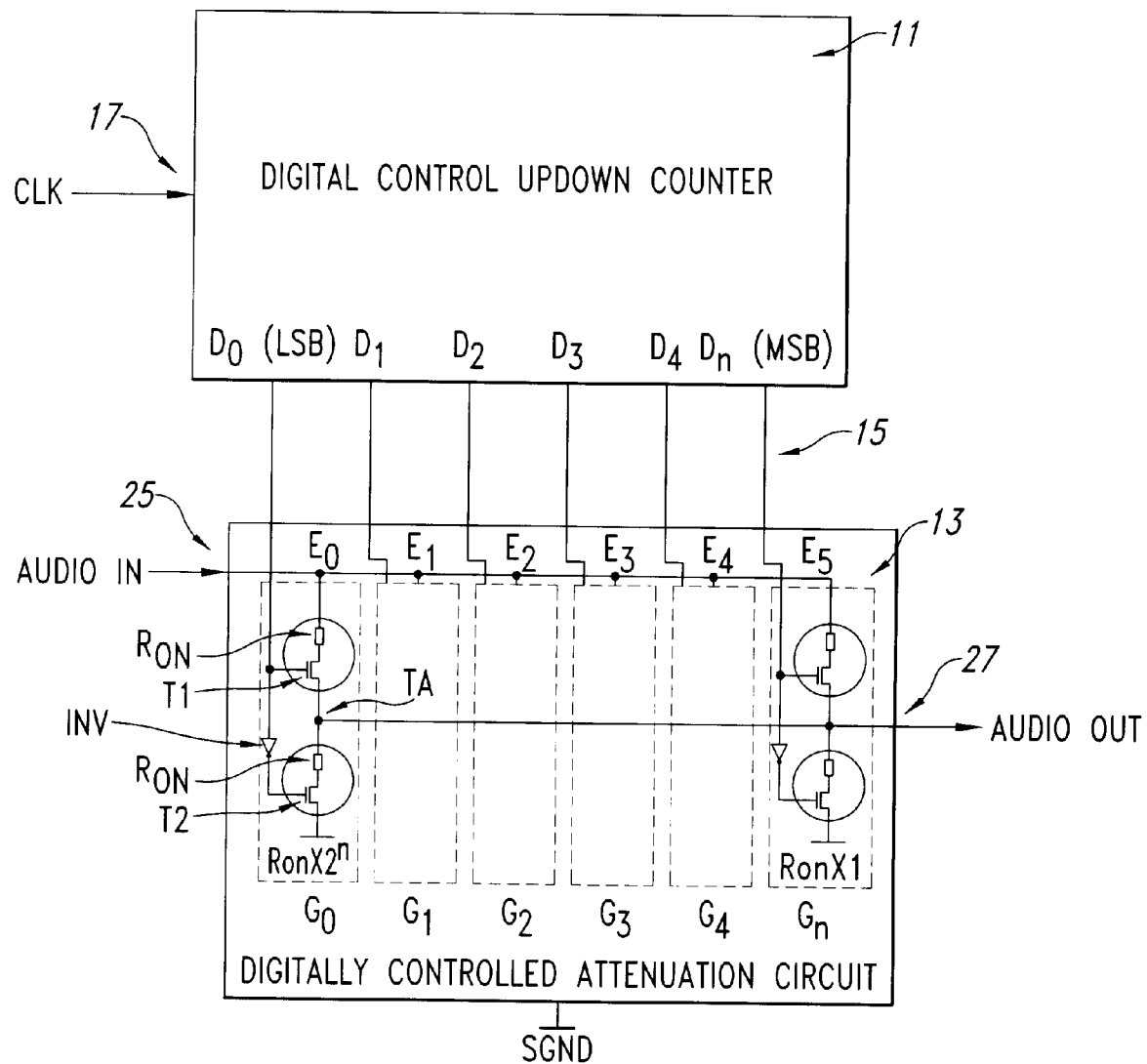
FIG. 4 shows a block diagram of an embodiment of a muting circuit according to the invention, with the attenuation circuit thereof having attenuation members of a first type.

FIG. 4 shows an embodiment of a muting circuit in which attenuation circuit 13 comprises a parallel connection with n attenuation members G0, G1, . . . Gn connected between audio signal input 25 and audio signal output 27. Each of these attenuation members has a partial voltage tap TA connected to audio signal output 27 as well as a first MOS transistor T1 connected between audio signal input 25 and partial voltage tap TA and a second MOS transistor T2 connected between partial voltage tap TA and signal ground terminal SGND. Each of these MOS transistors represents in practice the series connection of an ON-resistor Ron and an electronic switch constituted by the switching transistor. The gate electrodes of T1 and T2 of the individual attenuation members G0 to Gn are each connected to one of the count signal output terminals D0 to Dn, the gate electrode of T1 being directly connected thereto and the gate electrode of T2 via an inverter INV, or vice versa, when T1 and T2 are MOS transistors of the same channel type. If one uses for T1 and T2 MOS transistors of different channel type, inverter INV is not necessary. The two transistors T1 and T2 are thus switched in opposite manner, such that in each particular case one thereof is rendered conducting and the respective other one is rendered nonconducting.

The ON-resistors Ron of transistors T1 and T2 of the individual attenuation members G0 to Gn are differently large, depending on which particular binary number position of the data word transferred from counter 11 via data line 15 to the attenuation circuit 13 controls the respective attenuation member. Assuming that in the present embodiment the two count signal output terminals D0 and Dn have the lowest-value bit (LSB) and the highest-value bit (MSB) of the data word associated therewith, respectively, this embodiment, with respect to the resistances ON-resistors Ron of the attenuation members G0 to Gn, makes use of the weighting Ron x $2^n$ with the lowest-value ON-resistor Ron x 1 being associated with the attenuation member Gn associated with the highest-value bit, while in the embodiment shown with six count signal output terminals the attenuation member G0 belonging to the lowest-value bit has an ON-resistance Ron x $2^5$ associated therewith.

Differently from the embodiment shown in FIG. 4, the individual attenuation members G0 to Gn may also be composed, in terms of components, with mutually separate resistors and swvitches, with each attenuation member then having a first series connection connected between audio signal input 25 and partial voltage tap TA and including a first resistor and a first controllable switch, as well as a second series connection connected between partial voltage tap TA and signal ground terminal SGND and including a second resistor and a second controlled switch.

Figure 5:
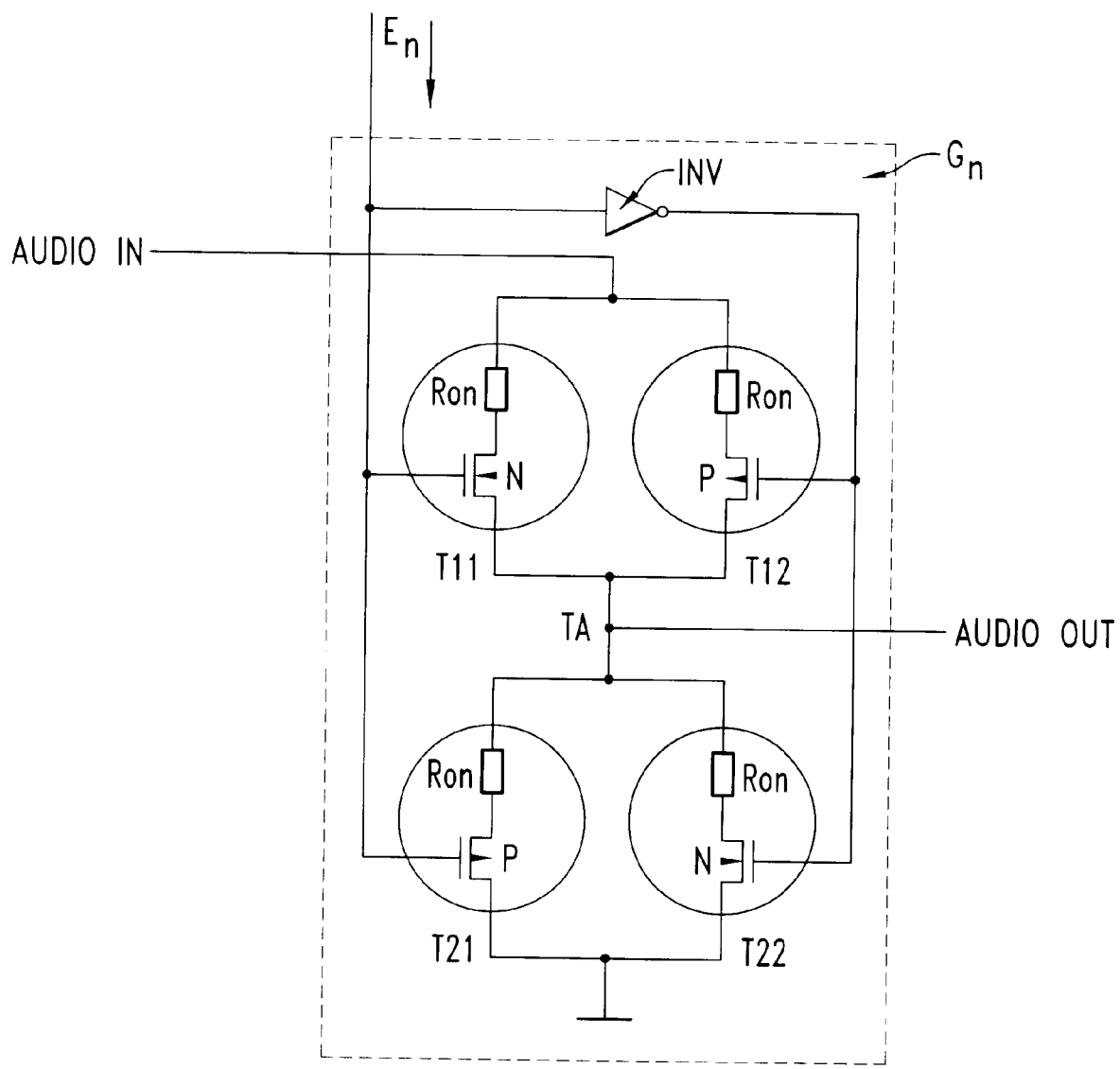
FIG. 5 shows an attenuation member of a second type which is usable for an attenuation circuit of a muting circuit according to the invention.

FIG. 5 shows a tfuither possibility of an attenuation member which is suitable for attenuation circuit 13. It is assumed in this respect that in FIG. 5 the attenuation member Gn is shown, for example, and the other attenuation members G0 to G4 are constructed identically.

Differently from the embodiment of attenuation members shown in FIG. 4, the attenuation member shown in FIG. 5 comprises, between audio signal input 25 and audio signal output 27 on one hand and audio signal output 27 and signal ground terminal SGND on the other hand, one parallel connection each consisting of an NMOS transistor T11 and T22, respectively, and a PMOS transistor T12 and T21, respectively. The ON-resistors Ron of all four transistors T11, T12, T21 and T22 are identical. The gate electrodes of T11 and T21 are connected directly, and the gate electrodes of T12 and T22 via an inverter INV, to the respectively associated control signal input terminals E0 to En. The four transistors T11, T12, T21 and T22 are each switched in opposite manner such that in each particular case either the transistor pair T11 and T12 or the transistor pair T21 and T22 is rendered conducting and the respective other transistor pair is rendered nonconducting. By means of such an attenuation member, the linearity improvement mentioned hereinbefore is obtained.

In the embodiments shown in FIGS. 4 and 5, the attenuation circuit 13 constitutes, between audio signal input 25 and audio signal output 27 on the one hand and audio signal input 27 and signal ground terminal SGND on the other hand, one parallel connection, consisting of several ON-resistors Ron having ON-resistances weighted in accordance with the binary number system. How many of the respective parallel-connected ON-resistors with different ON-resistances participate in the parallel connection in each particular case is dependent upon the particular data word transferred via data line 15. It is assumed as an example, that with a binary value 0 of a data word position in case of the embodiment of FIG. 4, T1 is controlled to the blocked state and T2 to the conducting state, while in case of the embodiment shown in FIG. 5 T11 and T12 are controlled to the blocked state and T21 and T22 to the conducting state. When all positions of the data word have the binary value 0, all transistors connected between audio signal input 25 and audio signal output 27 are blocked, whereas all transistors located between audio signal output 27 and signal ground SGND are conducting and the amplitude of the audio signal arising at audio signal output 27 is virtually 0. If, in contrast thereto, all positions of the data word have the logic value 1, all transistors located between audio signal input 25 and audio signal output 27 are conducting and all transistors between audio signal output and signal ground SGND are blocked, so that the audio signal is subjected to virtually no attenuation between audio signal input 25 and audio signal output 27. In case of data words in which part of the data word positions have the logic value 0 and part of the data word positions have the logic value 1, a signal amplitude at audio signal output 27 which is between 0 and the unattenuated amplitude.

In this way it is possible to achieve a change of attenuation of the type shown in FIG. 2 or in FIG. 3 by changing the count of counter 11.

What is claimed is:

1. An electric muting circuit for soft muting of an audio signal comprising:

a digitally controllable attenuation circuit having an audio signal input, an audio signal output and a control signal input, and an up/down counter having a clock pulse input for being fed with clock pulses to be counted, a counting control input for being fed with a counting control signal controlling counting start and counting stop, and a count signal output from which a digital count signal is available and which is connected to the control signal input of the attenuation circuit wherein;

a digital count signal in the form of an n-position data word is delivered from the count signal output of the counter to the control signal input of attenuation circuit, with n being a predetermined integer greater than one, and wherein the attanuuation circuit contains n parallel attenuation members connected between the audio signal input and a signal ground terminal, each said attenuation member comprising:

a partial voltage tap conncted to the audio signal output, a first series connection connected between the audio signal input and the partial voltage tap and including a first resistor and a first controllable switch, a second series connection connected between the partial voltage tap and the signal ground terminal and including a second resistor and a second controlled switch, and a switch control means through which the two swtches of each attenuation member are controllable in opposite manner such that in each particular case one of the two switches is rendered conducting and the respective other switch is rendered non-conducting, wherein the switch contirol means of the attenuation members being each adapted to be fed with a different one of the n positions of the data word as switching control signal, and wherein the resistances of the resistors of the different individual attenuation members are different, depending on the significance of the positions of the data word associated with the individual attenuation members.

2. The muting circuit of claim 1 wherein the clock pulse input of the counter is adapted to be fed with a clock pulse signal having a clock frequency that is variable in predeterminable manner.

3. The muting circuit of claim 2 wherein the clock pulse input of the counter is connected to a clock pulse source of variable pulse frequency.

4. The muting circuit of claim 2 wherein the clock pulse input of the counter is adapted to be connected to one of several clock pulse sources of different clock frequency in selectable manner via a selection means.

5. The muting circuit of claim 4 wherein the selection means is controllable in accordance with at least one selection program, under the control of which the clock pulse input of the counter can be fed with a clock signal having a clock frequency changing in predetermined manner.

6. The muting circuit of claim 2 wherein the variable clock pulse frequency is controllable in accordance with at least one selection program, under the control of which the clock pulse input of the counter can be fed with a clock signal having a clock frequency changing in a predetermined manner.

7. The muting circuit of claim 1 wherein each switch is composed of a MOS switch.

8. The muting circuit of claim 8 wherein each MOS switch is composed witlhi a parallel connection having an NMOS transistor and a PMOS transistor which can be rendered conducting or non-conducting always at the same time, wherein, in the ON-state, resister respectively coupled to the NMOS and the PMOS transistors of said parallel connection of said each MOS switch are arranged parallel to each other constitute the respectively associated resistor of the attenuation member.

9. The muting circuit of claim 1 wherein a data line connecting the counter and the attenuation circuit is composed as a parallel data line with n bit lines and thc control signal input of attenuation circuit has in corresponding manner n control signal terminals, and wherein, for each attenuation member, either the first switch comprising an NMOS transistor and a second switch comprising a PMOS transistor are adapted to the associated switching control signal applied thereto directly; or the first switch comprising a PMOS transistor and the second switch comprising an NMOS transistor are adapted to the associated switchig control signal applied thereto through an inverter.

10. A digitally controlled audio attenuation circuit, comprising:

an input terminal for receiving an audio signal;

a plurality of parallel paths coupled between the input terminal and a ground terminal, each path including a switch and having a resistance value;

an output terminal coupled to all of the parallel paths;

a plurality of switch contTollers, each operable to control the switch in a respective one of the parallel paths; and a bi-directional digital counter having a plurality of outputs, each output coupled to a respective one of the switch controllers wherein each of the parallel paths comprises:

a pair of switches serially coupled between the input terminal and the ground terminal;

a connection to the output terminal located between the pair of switches wherein each pair of switches is controlled by a respective one of the outputs of the counter.

11. The audio attenuation circuit of claim 10 wherein the digital counter further comprises:

a clock pulse input terminal for accepting a series of pulses; and a counting input terminal for receiving a signal which is adapted to enable or disable the counter.

12. The audio attenuation circuit of claim 11 wherein the series of pulses varies in frequency.

13. The audio attenuation circuit of claim 11, further including a pulse frequency selection switch coupled to the clock pulse input terminal, the pulse frequency selection switch for determining which of a plurality of clock frequency pulses is coupled to the clock pulse input terminal.

14. The audio attenuation circuit of claim 13 wherein the clock frequency pulses capable of being coupled to the clock pulse input terminal vary in frequency.

15. The audio attenuation circuit of claim 11 wherein the pulse frequency selection switch is controllable to select, at any given time, any one of the plurality of clock frequency pulses.

16. The audio attenuation circuit of claim 10 wherein one of the switches of a respective one of the pairs is an NMOS transistor, the other switch in the respective pair is a PMOS transistor, and an inverter is directly coupled between the gates of the switches.

17. A digitally controlled audio attenuation circuit, comprising:

an input terminal for receiving an audio signal;

a plurality of parallel paths coupled between the input terminal and a ground terminal, each path including a switch and having a resistance value;

an output terminal coupled to all of the parallel paths;

a plurality of switch controllers, each operable to control the switch in a respective one of the parallel paths; and a bi-directional digital counter having a plurality of outputs, each output coupled to a respective one of the switch controllers wherein each of the parallel paths comprises:

a first pair of parallel transistors coupled between the input terminal and the output terminal; and a second pair of parallel transistors coupled between the output terminal and the ground terminal wherein all of the transistors in the respective path are controlled by the same one of the outputs of the counter.

18. The audio attenuation circuit of claim 17 wherein each pair of the parallel transistors comprises one NMOS transistors and one PMOS transistor.

19. The audio attenuation circuit of claim 17 wherein an inverter is coupled to the gates of a PMOS transistor of the first pair of parallel transistors and an NMOS transistor of the second pair of parallel transistors.

* * * * *